(12) United States Patent
Ikeda et al.

(10) Patent No.: US 8,241,999 B2
(45) Date of Patent: Aug. 14, 2012

(54) SEMICONDUCTOR DEVICE HAVING A PROTECTION PATTERN WITH TWO ELEMENT SEPARATION REGIONS

(75) Inventors: Takafumi Ikeda, Yokohama (JP);
Takahito Nakazawa, Funabashi (JP);
Hideaki Maekawa, Yokohama (JP);
Yuuichi Tatsumi, Tokyo (JP); Toshifumi Minami, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 298 days.

(21) Appl. No.: 12/706,056

(22) Filed: Feb. 16, 2010

(65) Prior Publication Data

US 2010/0237438 A1    Sep. 23, 2010

(30) Foreign Application Priority Data

Mar. 23, 2009    (JP) .................. 2009-070165

(51) Int. Cl.
*H01L 23/544*    (2006.01)
*H01L 21/301*    (2006.01)
(52) U.S. Cl. .......... 438/462; 438/33; 438/113; 257/620
(58) Field of Classification Search .................. 257/620; 438/33, 113, 462
See application file for complete search history.

(56) References Cited

U.S. PATENT DOCUMENTS

| 2002/0043700 | A1* | 4/2002 | Sasaki et al. | 257/620 |
| 2005/0269702 | A1* | 12/2005 | Otsuka | 257/750 |
| 2006/0012003 | A1* | 1/2006 | Mallikarjunaswamy et al. | 257/501 |
| 2009/0146260 | A1* | 6/2009 | Eto | 257/620 |
| 2009/0321889 | A1* | 12/2009 | Summerfelt et al. | 257/620 |

FOREIGN PATENT DOCUMENTS

| JP | 2002-261050 | 9/2002 |
| JP | 2004-297022 | 10/2004 |
| JP | 2006-261613 | 9/2006 |
| JP | 2006-303073 | 11/2006 |
| JP | 2008-270488 | 11/2008 |

OTHER PUBLICATIONS

Japanese Office Action issued Jul. 1, 2011, in Patent Application No. 2009-070165 (with English-language translation).
Office Action issued Oct. 28, 2011 in Japanese Patent Application No. 2009-070165 (with English translaton).

* cited by examiner

*Primary Examiner* — N Drew Richards
*Assistant Examiner* — Peter Bradford
(74) *Attorney, Agent, or Firm* — Oblon, Spivak, McClelland, Maier & Neustadt, L.L.P.

(57) ABSTRACT

A semiconductor device has a circuit element region formed on a semiconductor substrate, and a protective pattern formed so as to surround the circuit element region. The protective pattern comprises a first element separation region formed on the semiconductor substrate, a second element separation region formed on the semiconductor substrate and having a width smaller than that of the first element separation region, a first element region formed between the first element separation region and the second element separation region, a first gate layer formed on the first element separation region, a wiring layer formed on the first gate layer, a passivation layer formed above the wiring layer, a second element region, an insulation film formed on the second element region, and a second gate layer formed on the insulation film, the first element separation region, the first element region, the second element separation region and the second element region being located in this order from the nearer side of the circuit element region.

5 Claims, 3 Drawing Sheets

SEMICONDUCTOR DEVICE HAVING A PROTECTION PATTERN WITH TWO ELEMENT SEPARATION REGIONS

CROSS REFERENCE TO RELATED APPLICATION

This application is based upon and claims benefit of priority from the Japanese Patent Application No. 2009-70165, filed on Mar. 23, 2009, the entire contents of which are incorporated herein by reference.

BACKGROUND OF THE INVENTION

The present invention relates to a protective pattern of a semiconductor device.

Typically, plural integrated circuits are formed on a wafer in a semiconductor device manufacturing process. The wafer is die-cut into individual IC chips (see Japanese Patent Application Laid-Open No. 2002-261050). Plural semiconductor devices are manufactured from one wafer.

A stress is applied to a chip at die-cut. The stress causes cracks (chip cracks). A protective pattern is provided around the circuit element region of the chip to prevent cracks from being spread into the circuit element region.

The protective pattern has an element region formed on a substrate (wafer), an element separation region, a dummy gate layer, a dummy wiring layer, and a passivation layer formed on them. A fewer number of stacked substances on the substrate are preferred on a region (dicing line) to perform die-cut. The passivation layer is removed on the dicing line side of the protective pattern.

The stress applied to the chip at die-cut tends to be strong in a location where the material and the configuration are changed. Cracks are caused in a location near the circuit element region, which influences the circuit element region to be protected. To reduce the influence, the protective pattern is increased so that the crack caused location is as far as possible from the circuit element region. In such technique, the chip size is increased and the number of chips which can be manufactured from one wafer is reduced.

There has been known a configuration provided with a stacked structure in which plural contacts and wiring layers are stacked on the dicing line side rather than at the end of the passivation layer. The stacked structure acts as a stopper preventing the progress of cracks and pattern separation. In such configuration, the area of the protective pattern is increased due to the arrangement of the stacked structure. As stated above, the chip size is increased and the number of chips which can be manufactured from one wafer is reduced.

SUMMARY OF THE INVENTION

According to one aspect of the present invention, there is provided a semiconductor device comprising:
a semiconductor substrate;
a circuit element region formed on the semiconductor substrate; and
a protective pattern formed so as to surround the circuit element region,
the protective pattern comprising:
a first element separation region formed on the semiconductor substrate;
a second element separation region formed on the semiconductor substrate and having a width smaller than that of the first element separation region;
a first element region formed between the first element separation region and the second element separation region;
a first gate layer formed on the first element separation region;
a wiring layer formed on the first gate layer;
a passivation layer formed above the wiring layer;
a second element region;
an insulation film formed on the second element region; and
a second gate layer formed on the insulation film, wherein
the first element separation region, the first element region, the second element separation region and the second element region are located in this order from the nearer side of the circuit element region.

According to one aspect of the present invention, there is provided a semiconductor device comprising:
a semiconductor substrate;
a circuit element region formed on the semiconductor substrate; and
a protective pattern formed in at least a portion surrounding the circuit element region,
the protective pattern comprising:
a diffusion layer region formed in the surface portion of the semiconductor substrate;
a first stacked structure having plural contact plugs and plural wiring layers stacked on the diffusion layer region;
a second stacked structure having plural contact plugs and plural wiring layers stacked on the diffusion layer region, formed on the circuit element region side rather than on the first stacked structure, and electrically separated from the first stacked structure; and
a passivation layer formed on the first stacked structure and the second stacked structure so that its end opposite from the circuit element region is located on the circuit element region side rather than at the end opposite from the circuit element region of the first wiring layer.

DESCRIPTION OF THE EMBODIMENTS

Hereafter, embodiments of the present invention will be described with reference to the drawings.

(First Embodiment)

Figure 1:
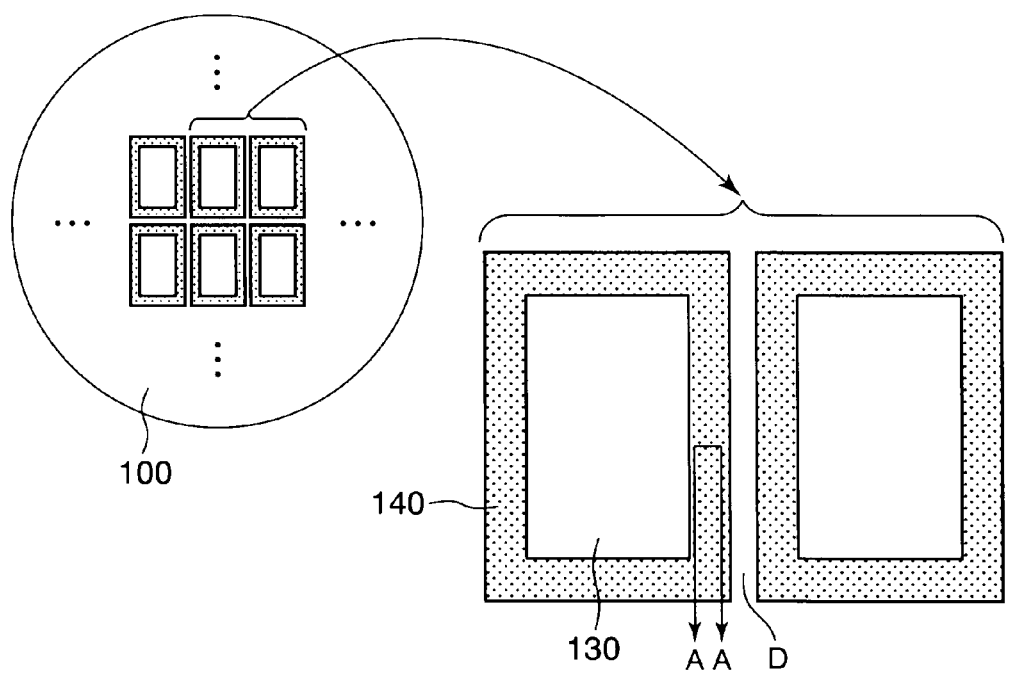
FIG. 1 is a plan view of a wafer according to a first embodiment of the present invention.

FIG. 1 shows a plan view of a wafer according to a first embodiment of the present invention. As shown in FIG. 1, plural circuit element regions 130 formed with circuit elements are provided on a wafer 100. A dicing line D is provided between the circuit element regions 130 adjacent to each other. The dicing line D is a region to perform die-cut. The wafer 100 is die-cut along the dicing line D. Plural chips having the circuit element regions 130 can be formed.

A protective pattern 140 is provided on the outer periphery of each of the circuit element regions 130. The protective pattern 140 prevents cracks caused by a stress due to die-cut from being spread into the circuit element region 130.

Figure 2:
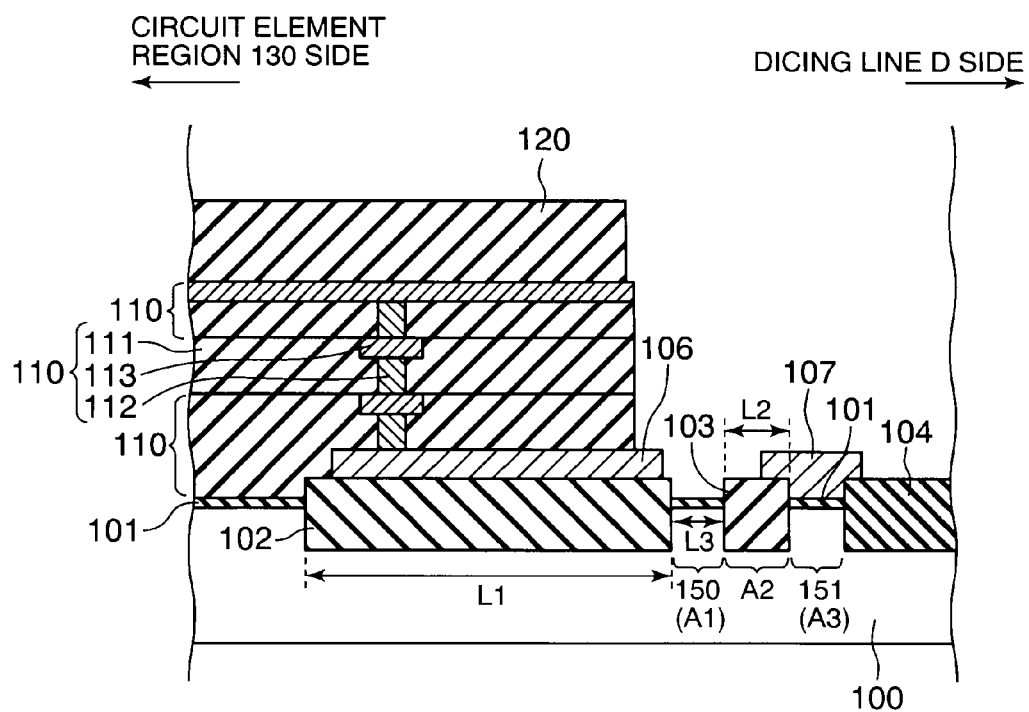
FIG. 2 is a schematic block diagram of a semiconductor device according to the first embodiment.

The structure of the protective pattern 140 will be described using FIG. 2. FIG. 2 shows the longitudinal section taken on line A-A of FIG. 1. The cross sections of all portions of the protective pattern 140 surrounding the circuit element region 130 have the same structure of FIG. 2.

Element regions 150 and 151 and element separation regions 102, 103, and 104 are formed on the semiconductor substrate (wafer) 100. A width L1 of the element separation region 102 is larger than a width L2 of the element separation region 103. The width L1 of the element separation region 102 is larger than a width L3 of the element region 150. The width L1 is 3 μm, and the widths L2 and L3 are 1 μm.

The element separation regions 102 to 104 have an STI (Shallow Trench Isolation) structure in which a trench is formed in the semiconductor substrate 100 and an insulation film (e.g., silicon oxide film) is buried in the trench. The element regions 150 and 151 and the element separation regions 102 to 104 are formed by the same known process as the element regions and the element separation regions of the circuit element region 130.

Gate layers 106 and 107 are formed on the element separation region 102 and the insulation film 101 on the element region 151. The gate layers 106 and 107 are polysilicon films having a film thickness of about 150 nm. The gate layers 106 and 107 are formed by the same known process as the gate electrode of the transistor of the circuit element region 130. The gate electrode of the transistor of the circuit element region 130 is the gate electrode of a memory cell transistor as the word line of the semiconductor memory.

Plural wiring levels 110 are stacked over the semiconductor substrate 100. Each of the wiring levels 110 has an interlayer insulation film 111, a contact plug 112, and a wiring layer 113. Stacked films of a silicon oxide film and a silicon nitrided film are used as the interlayer insulation film 111. Tungsten and copper are used as the contact plug 112. Copper, aluminum, and tungsten are used as the wiring layer 113. The contact plug 112 and the wiring layer 113 are integrally formed for a dual-damascene structure. The wiring level 110 is formed by the same known process as the wiring level of the circuit element region 130.

A passivation layer 120 is formed on the topmost wiring level 110. The passivation layer 120 includes a silicon oxide film and a silicon nitrided film.

The passivation layer 120 and the plural wiring levels 110 are not provided on the dicing line D side rather than on the element separation region 102. After the plural wiring levels 110 and the passivation layer 120 are formed, the passivation layer 120 and the wiring levels 110 on the dicing line D side rather than on the element separation region 102 are removed by RIE (Reactive Ion Etching) to obtain such structure.

The end on the dicing line D side of the wiring level 110 is located on the circuit element region 130 side rather than at the end on the dicing line D side of the gate layer 106. The end on the dicing line D side of the passivation layer 120 is located on the circuit element region 130 side rather than at the end on the dicing line D side of the wiring level 110.

A stress applied to the chip at die-cut tends to be strong in a location where the material and the configuration are changed.

The gate layer 106 and the element separation region 102 are provided below the end of the passivation layer 120. On the dicing line D side seen from the element separation region 102, a region A1 formed with the element region 150, a region A2 formed with the element separation region 103, and a region A3 formed with the element region 151 and the gate layer 107 are provided. The plural regions having different hardness are continuously provided.

The strong stress caused at die-cut concentrates on the regions A1 to A3 on the dicing line D side rather than at the end of the passivation layer 120. Cracks are caused in these regions. Cracks are hard to be caused on the circuit element region 130 side rather than at the end of the passivation layer 120. The influence of the cracks on the circuit element region 130 can be reduced.

The stress concentrates on the specific locations (the regions A1 to A3) to cause cracks. Cracks near the circuit element region 130 can be prevented. The distance between the end of the passivation layer 120 and the circuit element region 130 need not be long. Plural patterns need not be formed between the end of the passivation layer 120 and the dicing line D. The chip size can be reduced.

(Second Embodiment)

Figure 3:
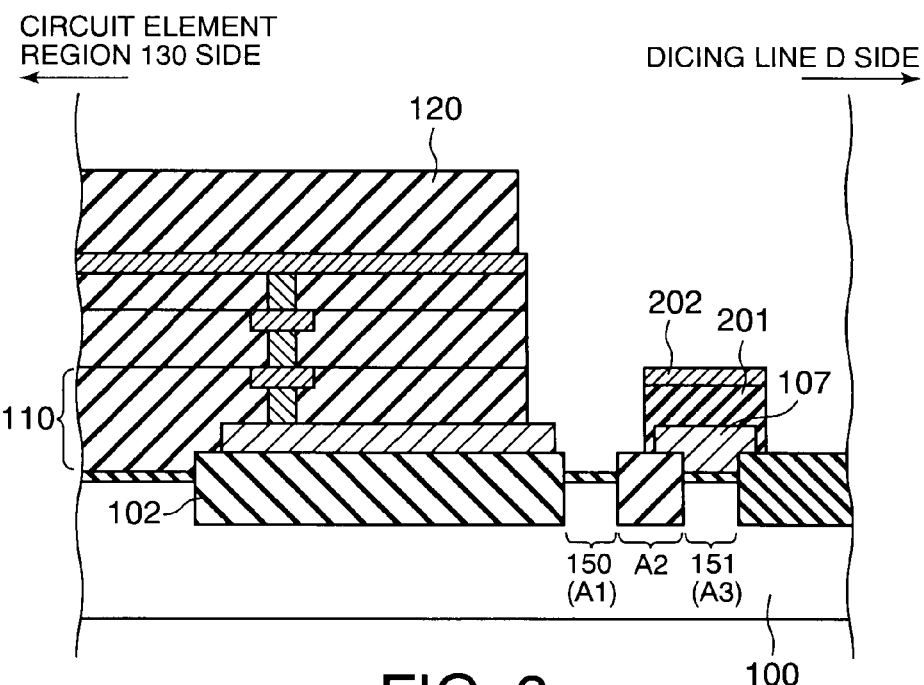
FIG. 3 is a schematic block diagram of a semiconductor device according to a second embodiment of the present invention.

FIG. 3 shows the schematic configuration of a semiconductor device according to a second embodiment of the present invention. The semiconductor device according to this embodiment has an insulation film 201 and a wiring layer 202 on the gate layer 107 of the semiconductor device according to the first embodiment shown in FIG. 2.

The insulation film 201 and the wiring layer 202 are formed by the same process as the wiring levels 110 as the first layer. The insulation film 201 is formed so as to cover the gate layer 107. In FIG. 3, the contact plug is not provided on the gate layer 107. The contact plug may be provided.

As described above, the gate layer 107 is formed by the same process as the gate electrode of the transistor of the circuit element region 130. When the gate electrode is silicified using the salicide technique, the gate layer 107 is also silicified. Co, Ti, and Ni are used for silicification.

In the first embodiment, when the passivation layer 120 and the wiring levels 110 are removed by RIE, the surface of the gate layer 107 is bare. The silicide material can be scattered.

In this embodiment, to prevent the scattering of the silicide material, the insulation film 201 and the wiring layer 202 corresponding to the wiring level 110 as the first layer are left on the gate layer 107 in the RIE process.

On the dicing line D side seen from the element separation region 102, the region A1 formed with the element region 150, the region A2 formed with the element separation region 103, and the region A3 formed with the element region 151, the gate layer 107, the insulation film 201, and the wiring layer 202 are provided. The plural regions having different hardness are continuously provided.

A strong stress caused at die-cut concentrates on the regions A1 to A3. Cracks are caused in these regions. Cracks are hard to be caused in regions other than the regions A1 to A3. The influence of the cracks on the circuit element region 130 can be reduced.

The stress concentrates on the specific locations (the regions A1 to A3) to cause cracks. Cracks near the circuit element region 130 can be prevented. The distance between the end of the passivation layer 120 and the circuit element region 130 need not be long. Plural patterns need not be formed between the end of the passivation layer 120 and the dicing line D. The chip size can be reduced.

The scattering of the silicide material in the surface portion of the gate layer 107 in the RIE process of the passivation layer 120 and the wiring levels 110 can be prevented.

In the example shown in FIG. 3, the insulation film and the wiring layer corresponding to the wiring level as the first layer are left on the gate layer 107. The insulation film and the wiring layer corresponding, not only to the first layer, but also to the second layer, may be left. A fewer number of stacked substances on the semiconductor substrate 100 are preferred on the dicing line D side. Only the insulation film and the wiring layer corresponding to the wiring level as the first layer are preferably left.

(Third Embodiment)

Figure 4:
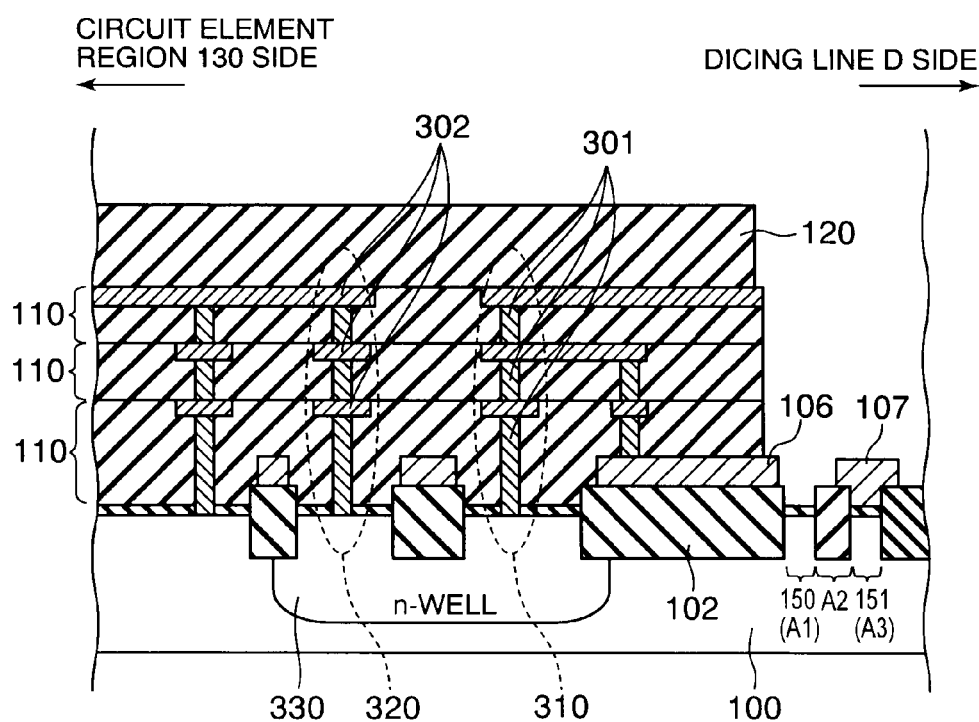
FIG. 4 is a schematic block diagram of a semiconductor device according to a fourth embodiment of the present invention.

FIG. 4 shows the schematic configuration of a semiconductor device according to a third embodiment of the present invention. The semiconductor device according to this embodiment has stacked structures 310 and 320 in which plural contact plugs 301 and wiring layers 302 are stacked on the circuit element region 130 side rather than on the element separation region 102 of the semiconductor device according to the first embodiment shown in FIG. 2.

The contact plug 301 and the wiring layer 302 of each layer are formed by the same process as the wiring level 110 as the corresponding layer. The semiconductor substrate 100 is a p-type silicon substrate. The stacked structures 310 and 320 are formed in an n-well region 330 in which phosphorous and arsenic are injected into the semiconductor substrate 100.

The stacked structures 310 and 320 act as a stopper which prevents the entering of water into the circuit element region 130 when water enters from the end side of the passivation layer 120, e.g., from between the layers of the wiring level 110.

The respective wiring layers of the stacked structure 310 and the respective wiring layers of the stacked structure 320 are disconnected. The flowing of ions used for the RIE process of the passivation layer 120 and the wiring levels 110 into the circuit element region 130 is prevented.

The wiring layers of the stacked structure 310 and the wiring layers of the stacked structure 320 are connected. Ions used for the RIE process flow into the circuit element region 130. The gate oxide film of the transistor can be damaged.

In this embodiment, ions used for the RIE process are discharged to the n-well region 330 via the stacked structure 310. The element of the circuit element region 130 can be protected from the influence of charge-up electrons.

As in the first embodiment, the strong stress caused at die-cut concentrates on the regions A1 to A3 on the dicing line D side rather than at the end of the passivation layer 120. Cracks are caused in these regions. Cracks are hard to be caused on the circuit element region 130 side rather than at the end of the passivation layer 120. The influence of cracks on the circuit element region 130 can be reduced.

The stress concentrates on the specific locations (the regions A1 to A3) to cause cracks. Cracks near the circuit element region 130 can be prevented. The distance between the end of the passivation layer 120 and the circuit element region 130 need not be long. Plural patterns need not be formed between the end of the passivation layer 120 and the dicing line D. The chip size can be reduced.

The element formed on the circuit element region 130 can be protected from charge-up electrons when the passivation layer and the wiring levels are RIE processed. The reliability can be improved.

In the third embodiment, the topmost wiring layer is extended to the end of the passivation layer 120. The wiring layer and the gate layer thereunder may be extended. The stacked structures 310 and 320 are disconnected to discharge charge-up electrons to the n-well region 330. The element of the circuit element region 130 can be protected.

Figure 5:
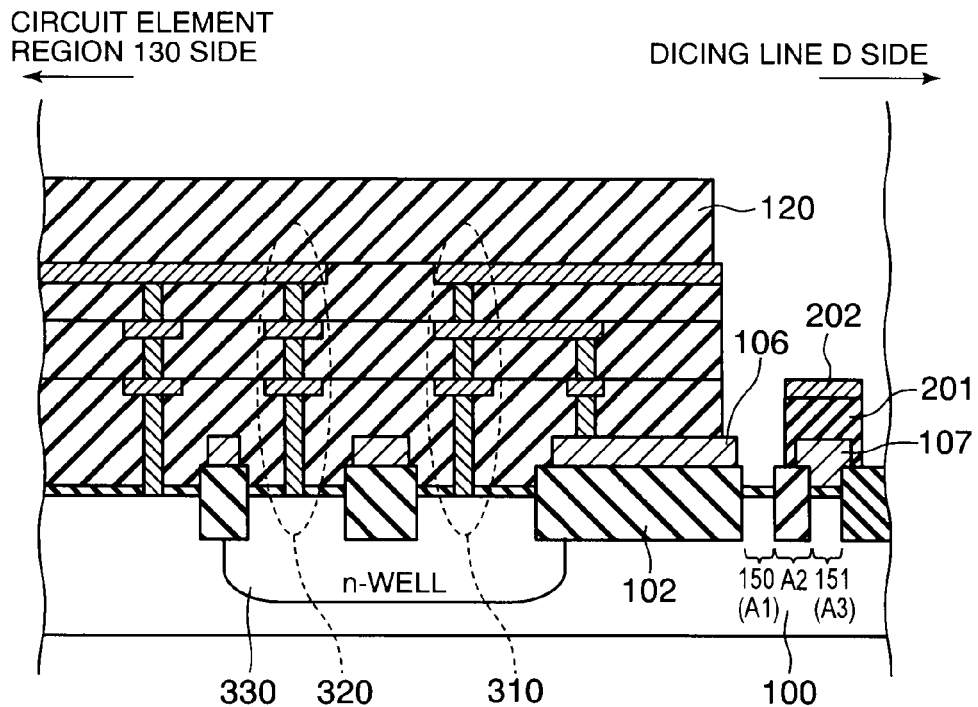
FIG. 5 is a schematic block diagram of a semiconductor device according to a modification.

The semiconductor device according to the third embodiment and the semiconductor device according to the second embodiment may be combined. As shown in FIG. 5, the semiconductor device has the stacked structures 310 and 320, the gate layer 107 on the dicing line D side rather than at the end of the passivation layer 120 being covered by the insulation film 201 and the wiring layer 202.

Figure 6:
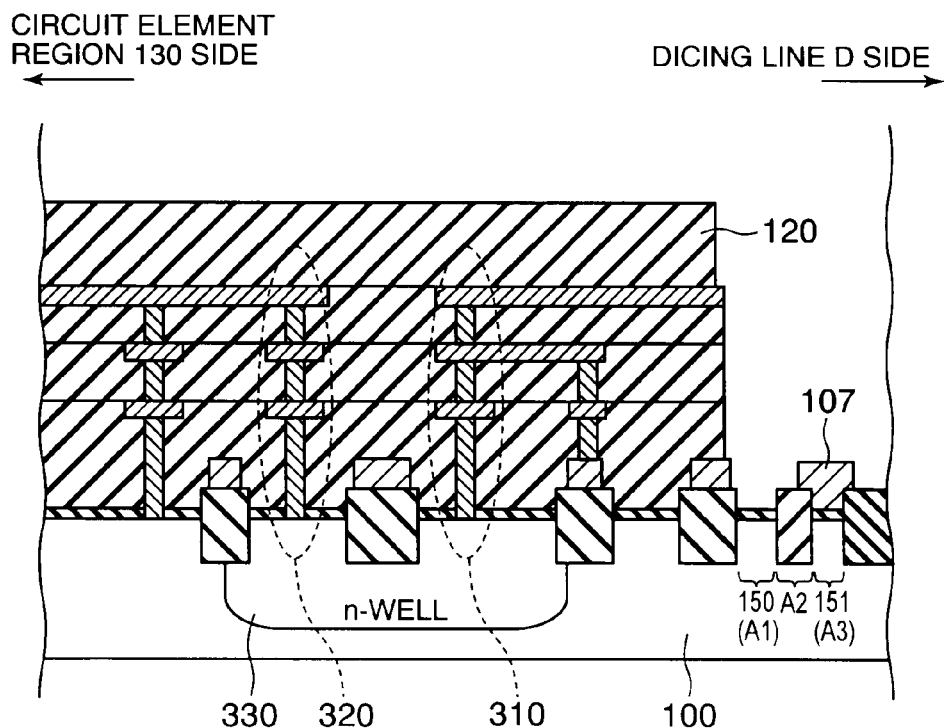
FIG. 6 is a schematic block diagram of a semiconductor device according to a modification.

As in the first embodiment, in the third embodiment, the wide element separation region 102 is provided below the end of the passivation layer 120. As shown in FIG. 6, the width of the element separation region 102 may be reduced.

In such configuration, cracks are easily caused in regions other than the regions A1 to A3. The spreading of cracks into the circuit element region 130 can be prevented by the stacked structures 310 and 320.

In the above embodiment, the protective pattern 140 surrounds the outer periphery of the circuit element region 130. The protective pattern 140 is also formed so as to surround part of the outer periphery.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a semiconductor substrate;
    a circuit element region formed on the semiconductor substrate; and
    a protective pattern formed so as to surround the circuit element region,
    the protective pattern comprising:
    a first element separation region formed on the semiconductor substrate;
    a second element separation region formed on the semiconductor substrate and having a width smaller than that of the first element separation region;
    a first element region formed between the first element separation region and the second element separation region;
    a first gate layer formed on the first element separation region;
    a wiring layer formed on the first gate layer;
    a passivation layer formed above the wiring layer;
    a second element region;
    an insulation film formed on the second element region; and
    a second gate layer formed on the insulation film, wherein
    the first element separation region, the first element region, the second element separation region and the second element region are located in this order from the nearer side of the circuit element region.

2. The semiconductor device according to claim 1, further comprising a second wiring layer formed above the second gate layer.

3. The semiconductor device according to claim 1, wherein a width of the first element region is smaller than that of the first element separation region.

4. The semiconductor device according to claim 1,
    wherein the end on the second element region side of the wiring layer is located on the circuit element region side rather than at the end on the second element region side of the first gate layer, and
    the end on the second element region side of the passivation layer is located on the circuit element region side rather than at the end on the second element region side of the wiring layer.

5. The semiconductor device according to claim 1, wherein the first gate layer and the second gate layer include a same material as a gate electrode of a transistor formed on the circuit element region.

* * * * *